(12) United States Patent
Fishburn et al.

(10) Patent No.: US 10,833,087 B2
(45) Date of Patent: Nov. 10, 2020

(54) SEMICONDUCTOR DEVICES INCLUDING TRANSISTORS COMPRISING A CHARGE TRAPPING MATERIAL, AND RELATED SYSTEMS AND METHODS

(71) Applicant: Micron Technology, Inc., Boise, ID (US)

(72) Inventors: Fredrick D. Fishburn, Hiroshima (JP); Haitao Liu, Boise, ID (US); Soichi Sugiura, Bristow, VA (US); Oscar O. Enomoto, Manassas, VA (US); Mark A. Zaleski, Boise, ID (US); Keisuke Hirofuji, Hiroshima (JP); Makoto Morino, Tokyo (JP); Ichiro Abe, Kanagawa (JP); Yoshiyuki Nanjo, Hyogo (JP); Atsuko Otsuka, Hiroshima (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/107,324

(22) Filed: Aug. 21, 2018

(65) Prior Publication Data

US 2020/0066726 A1 Feb. 27, 2020

(51) Int. Cl.
*H01L 27/00* (2006.01)
*H01L 27/108* (2006.01)
*H01L 29/423* (2006.01)
*H01L 29/66* (2006.01)

(52) U.S. Cl.
CPC .. *H01L 27/10823* (2013.01); *H01L 27/10852* (2013.01); *H01L 29/4236* (2013.01); *H01L 29/42352* (2013.01); *H01L 29/66666* (2013.01); *H01L 29/66833* (2013.01)

(58) Field of Classification Search
CPC .............................. H01L 27/115; H01L 28/60
See application file for complete search history.

(56) References Cited

U.S. PATENT DOCUMENTS

| 5,843,820 | A  | 12/1998 | Lu |
| 6,140,675 | A  | 10/2000 | Sugiura et al. |
| 7,495,973 | B2 | 2/2009  | Jung et al. |
| 7,517,754 | B2 | 4/2009  | McDaniel et al. |
| 7,759,715 | B2 | 7/2010  | Bhattacharyya |
| 8,309,427 | B2 | 11/2012 | Fishburn et al. |
| 8,330,210 | B2 | 12/2012 | Lai et al. |

(Continued)

OTHER PUBLICATIONS

Zhao et al., Review on Non-Volatile Memory with High-k Dielectrics: Flash for Generation Beyond 32nm, Materials, vol. 7, (2014), pp. 5117-5145.

(Continued)

*Primary Examiner* — Caridad Everhart
*Assistant Examiner* — Ankush K Singal
(74) *Attorney, Agent, or Firm* — TraskBritt

(57) ABSTRACT

A semiconductor device comprises a memory storage component and a transistor in operable communication with the memory storage element. The transistor comprises a source region, a drain region, a gate electrode between the source region and the drain region, a charge trapping material surrounding at least an upper portion of the gate electrode, and an oxide material on sides of the charge trapping material. Related systems and methods are also disclosed.

27 Claims, 9 Drawing Sheets

(56) References Cited

U.S. PATENT DOCUMENTS

| | | | |
|---|---|---|---|
| 8,394,699 B2 | 3/2013 | Haller et al. | |
| 9,117,547 B2 | 8/2015 | Barth, Jr. | |
| 9,741,721 B2 | 8/2017 | Park et al. | |
| 9,754,943 B1 | 9/2017 | Chang et al. | |
| 9,887,200 B2 | 2/2018 | Lin | |
| 2006/0043457 A1* | 3/2006 | Baik | G11C 16/0475 257/314 |
| 2006/0076598 A1* | 4/2006 | Higashi | H01L 27/105 257/296 |
| 2009/0047777 A1* | 2/2009 | Nagano | H01L 21/76837 438/593 |
| 2009/0250736 A1* | 10/2009 | Yoon | H01L 27/0688 257/296 |
| 2010/0176441 A1* | 7/2010 | Hirota | H01L 29/40117 257/324 |
| 2011/0175231 A1 | 7/2011 | Okazaki et al. | |
| 2013/0153982 A1* | 6/2013 | Lin | H01L 29/792 257/324 |
| 2014/0027913 A1 | 1/2014 | McDaniel et al. | |

OTHER PUBLICATIONS

Ramaswamy et al., Metal Gate Recessed Access Device (RAD) for DRAM Scaling, 2007 IEEE Workshop on Microelectronics and Electron Devices, Apr. 20, 2007, pp. 42-44.

Park et al., Double-Gate 1T-DRAM Cell Using Nonvolatile Memory Function for Improved Performance, Solid State Electronics, vol. 59, (2011), pp. 39-43.

* cited by examiner

SEMICONDUCTOR DEVICES INCLUDING TRANSISTORS COMPRISING A CHARGE TRAPPING MATERIAL, AND RELATED SYSTEMS AND METHODS

TECHNICAL FIELD

Embodiments disclosed herein relate to semiconductor devices including transistors comprising charge trapping materials. More particularly, embodiments of the disclosure relate to semiconductor devices including transistors comprising charge trapping materials, at least some of the transistors being in operable communication with a memory storage element, and to related systems and methods.

BACKGROUND

Conventional volatile memory cells, such as dynamic random access memory (DRAM) cells, may include a memory storage element and a transistor. The memory storage element may, for example, include a capacitor (e.g., sometimes referred to as a "cell capacitor" or a "storage capacitor") configured to store a logical state (e.g., a binary vale of either a "0" or a "1") defined by the stored charge in the capacitor. The transistor may be referred to in the art as an "access transistor." The transistor conventionally includes a channel region between a pair of source/drain regions and further includes a gate configured to electrically connect the source/drain regions to one another through the channel region. The channel region conventionally includes a semiconductor material, such as silicon.

To charge, discharge, read, or recharge the capacitor, the transistor may be selectively turned to an "on" state, in which current flows between the source region and the drain region through the channel region of the transistor. Application of a voltage greater than a threshold voltage ($V_t$) to the gate induces an inversion layer in the channel region, inducing a current flow between the drain region and the source region. The transistor may be selectively turned to an "off" state, in which the flow of current is substantially stopped.

In the off state, it is desirable for the capacitor associated with the transistor to retain a stored charge, without change (e.g., leakage thereof) through the transistor. However, conventional volatile memory cells may exhibit discharges of current over time and a resulting loss in stored charge. Therefore, even in the "off" state where the source region and the drain region of the associated transistor are electrically isolated (e.g., when an inversion layer is not present in the channel region) and the memory cell is unselected (e.g., not selected), current may leak from the capacitor. This off-state current is referred to in the art as sub-threshold leakage current. The undesirable leakage of charge from the capacitor requires the capacitor to be constantly refreshed (e.g., recharged) to maintain the logic state of the memory cell.

In addition to maintaining a low refresh rate, it is desirable for the transistor to exhibit sufficient flow of current (which may be referred to as a drive current) responsive to formation of the inversion layer when the transistor is in the on-state. To accomplish this, the transistor may be formed such that the gate electrode overlaps sufficiently with the source and drain regions (e.g., such that the gate electrode is located proximate the source region and the drain region). However, as the extent of overlap of the gate electrode with the source and drain regions increases, so-called gate-induced drain-leakage (GIDL) increases, wherein current leaks through the transistor when the transistor is in the off-state. As noted above, leakage of current from the capacitor when the transistor is in the off-state is undesired and results in a higher than desired refresh rate of the memory cell.

Semiconductor devices may include millions or even billions of memory cells. For example, semiconductor devices may include more than about 10 billion (10,000,000,000) memory cells. In some instances, one in every about one million memory cells may exhibit an excessive amount of gate induced drain leakage and may, therefore, fail testing of refresh rates during testing of the semiconductor device. In addition, in some instances, one in every about one million memory cells (which may be different than the one in every about one million cells that may not exhibit suitable refresh rates) may exhibit an increased external resistance and may, therefore, exhibit a drive current that is less than a desired amount and a data write time to memory cell exceeding a predetermined duration. Where the semiconductor device includes billions of memory cells, fail rates of one in every about one million may result in failure of over one thousand memory cells for every about one billion memory cells. Accordingly, a conventional semiconductor device may have thousands of memory cells that fail either one of refresh rates or drive current.

DETAILED DESCRIPTION

Figure 1:
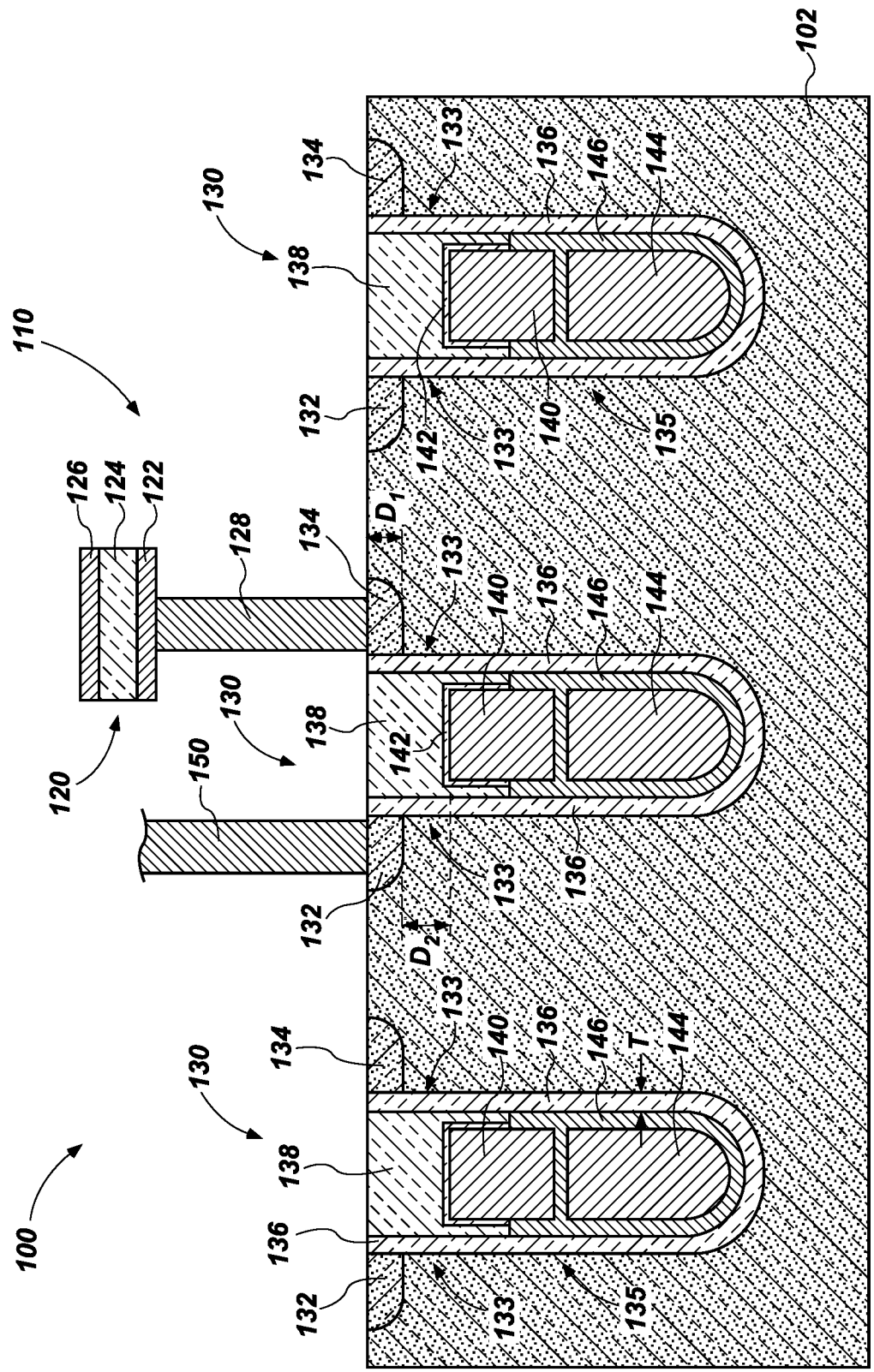
FIG. 1 is a simplified cross-sectional view of a semiconductor device, in accordance with embodiments of the disclosure.

The illustrations included herewith are not meant to be actual views of any particular systems, semiconductor structures, or semiconductor devices, but are merely idealized representations that are employed to describe embodiments herein. Elements and features common between figures may retain the same numerical designation except that, for ease of following the description, for the most part, reference numerals begin with the number of the drawing on which the elements are introduced or most fully described.

The following description provides specific details, such as material types, material thicknesses, and processing conditions in order to provide a thorough description of embodiments described herein. However, a person of ordinary skill in the art will understand that the embodiments disclosed herein may be practiced without employing these specific details. Indeed, the embodiments may be practiced in conjunction with conventional fabrication techniques employed in the semiconductor industry. In addition, the description provided herein does not form a complete description of a vertical transistor, a semiconductor device including vertical transistors, a complete description of a process flow for fabricating such a vertical transistor or a semiconductor device, or a complete description of a method of operating the semiconductor device. The structures described below do not form complete semiconductor device structures. Only those process acts and structures necessary to understand the embodiments described herein are described in detail below. Additional acts to form a complete semiconductor device or vertical transistor may be performed by conventional techniques.

As used herein, the terms "longitudinal," "vertical," "lateral," and "horizontal" are in reference to a major plane of a substrate (e.g., base material, base structure, base construction, etc.) in or on which one or more structures and/or features are formed and are not necessarily defined by Earth's gravitational field. A "lateral" or "horizontal" direction is a direction that is substantially parallel to the major plane of the substrate, while a "longitudinal" or "vertical" direction is a direction that is substantially perpendicular to the major plane of the substrate. The major plane of the substrate is defined by a surface of the substrate having a relatively large area compared to other surfaces of the substrate.

As used herein, the term "substantially" in reference to a given parameter, property, or condition means and includes to a degree that one of ordinary skill in the art would understand that the given parameter, property, or condition is met with a degree of variance, such as within acceptable tolerances. By way of example, depending on the particular parameter, property, or condition that is substantially met, the parameter, property, or condition may be at least 90.0 percent met, at least 95.0 percent met, at least 99.0 percent met, at least 99.9 percent met, or even 100.0 percent met.

As used herein, "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped, etc.) and the spatially relative descriptors used herein interpreted accordingly.

As used herein, the term "underlap" means and includes a distance between a portion of a gate electrode and a portion of a corresponding source region or drain region. For example, an underlap may include a distance by which the gate electrode and the corresponding source region or drain region are offset from each other, as opposed to gate electrodes that overlap, at least to some degree, with a corresponding source region or drain region.

As used herein, a "charge trap" means and includes a location in a material that restricts the movement of electrons, restricts the movement of holes, or both and may include hole traps, electron traps, or both.

According to embodiments described herein, a semiconductor device comprises an array of memory cells comprising a memory storage element (which may also be referred to herein as a "storage element") and an access device. The access device of at least one memory cell of the array of memory cells may comprise a transistor including a source region, a drain region, and a channel region between the source region and the drain region. In some embodiments, the transistor is at least partially formed within an opening defined in a semiconductor material. The transistor may include a gate electrode (e.g., a word line) within the trench. At least a portion of the gate electrode may be surrounded by a dielectric material (e.g., a gate dielectric material, which may also be referred to as a so-called "blocking material" or a "blocking oxide"). A charge trapping material may overlie at least portions of the dielectric material. Another dielectric material (which may be referred to as a "tunnel dielectric" or a "tunnel oxide") may overlie the charge trapping material and may be in contact with sidewalls of the trench. In some embodiments, the semiconductor material, the another dielectric material, the charge trapping material, the dielectric material, and the gate electrode may form a silicon-oxide-nitride-oxide-silicon (SONOS) structure configuration.

The charge trapping material may be formulated and configured to trap a charge (e.g., by generation of hole traps (e.g., hole trapping) within the charge trapping material, by trapping electrons in the charge trapping material). The extent of charge trapping of the charge trapping material may be controlled to tailor the electrical properties of the transistor (e.g., the threshold voltage, the on-current which may also be referred to as the "drive current" of the transistor), the amount of gate induced drain leakage, etc.). In some embodiments, the change trapping material of different memory cells of the array of memory cells may exhibit different properties, such as a different trap density. In use and operation, the extent of charge trapping of the charge trapping material may be controlled to individual memory cells or groups of memory cells, based on testing data of the memory cells. In other words, trapped holes may be formed in the charge trapping material of transistors of some memory cells of an array, while the charge trapping material of transistors of other memory cells in the array do not include trapped holes. Adjustment of the extent of charge trapping of the charge trapping material may affect, for example, the on-current (e.g., the drive current) of the memory cell, the amount of current leakage of the memory cell, or other electrical properties.

In some embodiments, transistors having the charge trapping material may facilitate formation of a semiconductor device exhibiting a reduced number of failed memory cells compared to conventional semiconductor devices. Accordingly, the semiconductor devices according to embodiments of the disclosure may exhibit an improved yield compared to conventional semiconductor devices. For example, due to variations in processing conditions, some transistors of the array may exhibit an unsuitable degree of gate induced charge leakage and a corresponding increase in refresh rate of the associated memory cell. Other transistors may exhibit an insufficient drive current in the on-state, along with an insufficient date write time to the memory cell (which may also be referred to as a so-called "write time recovery" (wRT)). According to embodiment described herein, at least some of the transistors may exhibit an increased extent of charge trapping relative to other transistors of the array. By way of nonlimiting example, transistors exhibiting an insufficient drive current may be exposed to a so-called programming voltage to induce charge trapping (e.g., trapped holes or trapped electrons) in the charge trapping material thereof, which may increase the drive current thereof. Accordingly, such transistors may exhibit improved drive current and an improved data write time to the memory cell, while also exhibiting desirable refresh rates, a reduced gate induced drain leakage, and a corresponding reduced variable retention time.

FIG. 1A is a simplified cross-sectional view of a semiconductor device 100, in accordance with embodiments of the disclosure. The semiconductor device 100 may include a plurality of memory cells 110, each memory cell 110 of the plurality including a memory storage element 120 and a transistor 130. In some embodiments, the transistors 130 are formed in openings 135 defined in a substrate 102. The substrate 102 may be a base material or a construction upon which additional materials are formed. The substrate 102 may be a semiconductor substrate, a base semiconductor layer on a supporting structure, a metal electrode or a semiconductor substrate having one or more layers, structures or regions formed thereon. The substrate 102 may be a conventional silicon substrate or other bulk substrate comprising a layer of semiconductive material. As used herein, the term "bulk substrate" means and includes not only silicon wafers, but also silicon-on-insulator ("SOT") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. The substrate 102 may be doped or undoped.

In some embodiments, the memory storage element 120 comprises a capacitor including, for example, a first electrode 122, a second electrode 126, and a dielectric material 124 between the first electrode 122 and the second electrode 126. The capacitor may be configured to store a charge, which may be correlated to a logic condition (e.g., a 0 state, a 1 state) of the memory cell 110.

The first electrode 122 and the second electrode 126 may include an electrically conductive material, such as a metal, a metal alloy, a conductive metal oxide, a conductive metal nitride, a conductive metal silicide, a conductively doped semiconductor material, or combinations thereof. The first electrode 122 and the second electrode 126 may independently comprise, for example, at least one of W, WN, Ni, Ta, TaN, TaSi, Pt, Cu, Ag, Au, Al, Mo, Ti, TiN, TiSi, TiSiN, TiAlN, MoN, Tr, IrOx, Ru, RuO$_x$, conductively doped silicon, another electrically conductive material, or combinations thereof.

The dielectric material 124 may include suitable dielectric materials for retaining a change of the capacitor. The dielectric material 124 comprises silicon dioxide, silicon nitride, polyimide, titanium dioxide (TiO$_2$), tantalum oxide (Ta$_2$O$_5$), aluminum oxide (Al$_2$O$_3$), an oxide-nitride-oxide material (e.g., silicon dioxide-silicon nitride-silicon dioxide), strontium titanate (SrTiO$_3$) (STO), barium titanate (BaTiO$_3$), hafnium oxide (HfO$_2$), zirconium oxide (ZrO$_2$), a ferroelectric material (e.g., ferroelectric hafnium oxide, ferroelectric zirconium oxide, lead zirconate titanate (PZT), etc.), a high-k dielectric material, or combinations thereof. In some embodiments, the dielectric material 124 comprises silicon dioxide. In some embodiments, the dielectric material 124 may include a dopant, such as one or more of silicon, aluminum, lanthanum, yttrium, erbium, calcium, magnesium, strontium, a rare earth element, or combinations thereof. The dielectric material 124 may be configured to storage a charge or other property associated with a logic state of the memory storage element 120. Accordingly, the memory storage element 120 may be referred to as a "cell capacitor" or a "storage capacitor."

Although the memory storage element 120 has been described and illustrated in FIG. 1 as comprising a capacitor, the disclosure is not so limited. In other embodiments, the memory cell 110 comprises another type of volatile memory cell including a memory storage element 120 other than a capacitor. In other embodiments, the memory storage element 120 may comprise a non-volatile memory cell, such as, for example, a resistive random-access memory (RRAM), ferroelectric random-access memory (FeRAM), conductive bridging random-access memory (CBRAM), phase-change memory, magnetoresistive random-access memory (MRAM), another type of memory, or combinations thereof.

The memory storage element 120 may be in operable communication with a transistor 130 of its respective memory cell 110. For example, a conductive material 128 may electrically connect the memory storage element 120 to a portion of the transistor 130. The conductive material 128 may comprise a suitable electrically conductive material, such as, for example, a material including tungsten, titanium, nickel, platinum, rhodium, ruthenium, iridium, aluminum, copper, molybdenum, silver, gold, a metal alloy, a metal-containing material (e.g., metal nitrides, metal silicides, metal carbides, metal oxides), a material including at least one of titanium nitride (TiN), tantalum nitride (TaN), tungsten nitride (WN), titanium aluminum nitride (TiAlN), iridium oxide (IrO$_x$), ruthenium oxide (RuO$_x$), alloys thereof, a conductively-doped semiconductor material (e.g., conductively-doped silicon, conductively-doped germanium, conductively-doped silicon germanium, etc.), polysilicon, other materials exhibiting electrical conductivity, or combinations thereof.

In some embodiments, the electrically conductive material 128 may be in electrical communication with electrically conductive lines extending in a first direction (e.g., a row direction). In some such embodiments, the electrically conductive material 128 may be referred to as a bit line contact, an access line contact, although the disclosure is not so limited.

Each of the transistors 130 may be in electrical communication with an electrically conductive material 150. The electrically conductive material 150 may include any of the materials described above with reference to the electrically conductive material 128. In some embodiments, the electrically conductive material 150 comprises the same material as the electrically conductive material 128. In some embodiments, the electrically conductive material 150 may be in electrical communication with electrically conductive lines extending in a second direction (e.g., a column direction, which may be substantially perpendicular to the first direction). In some such embodiments, the electrically conductive material 150 may be referred to as a digit line or a digit line contact, although the disclosure is not so limited.

Accordingly, an array of memory cells 110 may include memory cells 110 extending in rows in a first direction (e.g., left to right in the view of FIG. 1) and memory cells 110 extending in columns in a second direction (e.g., into and out of the plane in the view of FIG. 1).

In some embodiments, the semiconductor device 100 may include, for example, over one billion (1,000,000,000) memory cells 110, such as more than two billion, more than 4 billion, more than 8 billion, more than 10 billion, or more than 12 billion memory cells 110.

Although FIG. 1 illustrates only one transistor 130 electrically coupled to a memory storage element 120 for clarity, it will be understood that the other transistors 130 may be electrically coupled to separate memory storage elements 120 to form a memory cell 110.

Although FIG. 1 illustrates that the memory storage elements 120 are located above the transistors 130, the disclosure is not so limited. In other embodiments, the memory storage elements 120 may be located below the transistors 130 and may comprise, for example, trench capacitors.

The transistors 130 may include a source region 132 and a drain region 134 on opposing sides of the opening 135. A gate electrode 140 may be located within the opening 135 between the source region 132 and the drain region 134. A channel region 133 may be formed between the gate electrode 140 and the source region 132 and between the gate electrode 140 and the drain region 134 responsive to application of a suitable voltage (e.g., a voltage greater than a threshold voltage, $V_t$) to the gate electrode 140.

The source region 132 and the drain region 134 may be doped with one or more impurities to alter a conductivity of the source region 132 and the drain region 134. In some embodiments, the source region 132 and the drain region 134 are doped with N-type conductivity materials, such as one or more of phosphorus, arsenic, bismuth, etc. In other embodiments, the source region 132 and the drain region 134 are doped with P-type conductivity materials, such as one or more of boron, aluminum, gallium, or indium.

In some embodiments, the source region 132 may be doped at a dopant concentration between about $5\times10^{15}$ cm$^{-2}$ and about $5\times10^{21}$ cm$^{-2}$, such as between about $5\times10^{15}$ cm$^{-2}$ and about $1\times10^{17}$ cm$^{-2}$, between about $1\times10^{17}$ cm$^{-2}$ and about $1\times10^{18}$ cm$^{-2}$, between about $1\times10^{18}$ cm$^{-2}$ and about $1\times10^{19}$ cm$^{-2}$, or between about $1\times10^{19}$ cm$^{-2}$ and about $5\times10^{21}$ cm$^{-2}$. In some embodiments, the source region 132 is doped at a doping concentration between about $1\times10^{17}$ cm$^{-2}$ and about $1\times10^{18}$ cm$^{-2}$. In some embodiments, the source region 132 comprises a so-called "lightly doped" region.

The drain region 134 may be doped at a dopant concentration between about $5\times10^{15}$ cm$^{-2}$ and about $5\times10^{21}$ cm$^{-2}$, such as between about $5\times10^{15}$ cm$^{-2}$ and about $1\times10^{17}$ cm$^{-2}$, between about $1\times10^{17}$ cm$^{-2}$ and about $1\times10^{18}$ cm$^{-2}$, between about $1\times10^{18}$ cm$^{-2}$ and about $1\times10^{19}$ cm$^{-2}$, or between about $1\times10^{19}$ cm$^{-2}$ and about $5\times10^{21}$ cm$^{-2}$. In some embodiments, the dosing concentration of the drain region 134 may be substantially the same as the doping concentration of the source region 132. In some embodiments, the drain regions comprises a so-called "lightly doped drain" (LDD) region.

In some embodiments, the transistor 130 comprises a lateral transistor, wherein the source region 132 and the drain region 134 are located laterally adjacent to each other and at substantially the same distance from the substrate 102. In other embodiments, the transistor 130 may comprise a so-called vertical transistor, wherein one of the source region 132 and the drain region 134 overlies the other of the source region 132 and the drain region 134, the channel region 133 extending vertically between the source region 132 and the drain region 134.

A dielectric material 136 may overlie sidewalls of the openings 135. In some embodiments, the dielectric material 136 comprises an oxide material, and may be referred to herein as a "tunnel oxide" or a "tunneling oxide." The dielectric material 136 may comprise, for example, silicon dioxide ($SiO_2$), silicon oxynitride, silicon nitride, tetraethylorthosilicate (TEOS), aluminum oxide ($Al_2O_3$), aluminum silicon oxide (AlSiO), hafnium oxide, zirconium oxide, lanthanum oxide ($La_2O_3$), hafnium aluminum oxide (HfAlO), magnesium oxide (MgO), a structure comprising a nitride (e.g., silicon nitride) between two oxides (e.g., silicon dioxide) (e.g., an ONO structure), a material exhibiting Fowler-Nordhein tunneling, an oxide formed by atomic layer deposition (an ALD oxide such as, for example, aluminum oxide, zirconium oxide, hafnium oxide, or other oxides), another material, or combinations thereof. In other embodiments, the dielectric material 136 comprises silicon dioxide.

A charge trapping material 138 may overlie at least a portion of the dielectric material 136. The charge trapping material 138 may be located between the source region 132 and the drain region 134 at an upper portion of the opening 135. The charge trapping material 138 may be formulated and configured to trap a charge therein during testing of the semiconductor device 100 or during use and operation of the semiconductor device 100. The charge trapping material 138 may comprise, for example, silicon nitride (e.g., $Si_3N_4$). In other embodiments, the charge trapping material 138 comprises silicon oxynitride (e.g., $Si_xO_yN_z$), aluminum nitride (AlN), tantalum oxide ($Ta_2O_5$), titanium oxide ($TiO_2$), hafnium silicate (e.g., $HfSiO_4$), HfON, ZrON, AlGaN, $Y_2O_3$, $La_2O_3$, a high-k dielectric material (e.g., hafnium oxide, titanium oxide, zirconium oxide, niobium oxide (NbO, $NbO_2$, $Nb_2O_5$), molybdenum oxide (e.g., $MoO_2$, $MoO_3$), ruthenium oxide ($RuO_2$), strontium oxide (SrO), barium oxide (BaO), strontium titanium oxide ($SrTiO_3$), another high-k dielectric material), another charge trapping material, or combinations thereof.

A thickness T of the dielectric material 136 may be sufficient such that trapped charges within the charge trapping material 138 do not substantially detrap (e.g., tunnel through the dielectric material 136) during use and operation of the memory cell 110 associated with the transistor 130. The thickness T may be equivalent to between about 2 nm and about 6 nm of silicon dioxide. In other words, the equivalent oxide thickness (EOT) of the dielectric material 136 may be between about 2 nm and about 6 nm, such as between about 2 nm and about 4 nm or between about 4 nm and about 6 nm. It is believed that a sufficient EOT may facilitate retention of charges trapped within the charge trapping material 138 during use and operation of the memory cell 110.

As noted above, the gate electrode 140 may be located within the opening 135. In some embodiments, the gate electrode 140 is located at an upper portion of the opening 135. The gate electrode 140 may comprise an electrically conductive material such as, for example, tungsten, titanium, nickel, platinum, rhodium, ruthenium, iridium, aluminum, copper, molybdenum, silver, gold, a metal alloy, a metal-containing material (e.g., metal nitrides, metal silicides, metal carbides, metal oxides), a material including at least one of titanium nitride (TiN), tantalum nitride (TaN), tungsten nitride (WN), titanium aluminum nitride (TiAlN), iridium oxide ($IrO_x$), ruthenium oxide ($RuO_x$), alloys thereof, a conductively-doped semiconductor material (e.g., conductively-doped silicon, conductively-doped germanium, conductively-doped silicon germanium, etc.), polysilicon, other materials exhibiting electrical conductivity, or combinations thereof. In some embodiments, the gate electrode 140 comprises polysilicon. In some embodiments, the gate electrode 140 may be doped with one or more materials, such as, for example, one or more n-type dopants or one or more p-type dopants. In some embodiments, the gate electrode 140 is doped with a material having a conductivity different from the conductivity of the source region 132 and the drain region 134. In some embodiments, the gate electrode 140 comprises p+ type polysilicon.

In some embodiments, a dielectric material 142 may overlie at least a portion of the gate electrode 140. The dielectric material 142 may be referred to herein as a gate dielectric material. The dielectric material 142 may also be referred to herein as a "blocking oxide." The dielectric material 142 may comprise an oxide, such as, for example, silicon dioxide, tetraethylorthosilicate (TEOS), aluminum oxide ($Al_2O_3$), aluminum silicon oxide (AlSiO), hafnium oxide, zirconium oxide, lanthanum oxide ($La_2O_3$), hafnium aluminum oxide (HfAlO), magnesium oxide (MgO), a structure comprising a nitride (e.g., silicon nitride) between two oxides (e.g., silicon dioxide) (e.g., an ONO structure), or combinations thereof. In some embodiments, the dielectric material 142 comprises silicon dioxide. In some embodiments, the dielectric material 142 comprises silicon dioxide thermally grown from the material of the gate electrode 140, such as where the gate electrode 140 comprises polysilicon.

The transistor 130 may include a barrier material 146 disposed around at least a lower portion of the gate electrode 140. The barrier material 146 may be in contact with sides of the dielectric material 136. The barrier material 146 comprises a conductive nitride, such as titanium nitride, tungsten nitride, tantalum nitride, or a combination thereof. In some embodiments, the barrier material 146 comprises titanium nitride.

An electrically conductive material 144 may underlie the gate electrode 140 and may be separated therefrom by the barrier material 146. The electrically conductive material 144 may be referred to herein as a conductive contact or a conductive plug and may comprise an electrically conductive material, such as, for example, tungsten, titanium, nickel, platinum, rhodium, ruthenium, iridium, aluminum, copper, molybdenum, silver, gold, a metal alloy, a metal-containing material (e.g., metal nitrides, metal silicides, metal carbides, metal oxides), a material including at least one of titanium nitride (TiN), tantalum nitride (TaN), tungsten nitride (WN), titanium aluminum nitride (TiAlN), iridium oxide ($IrO_x$), ruthenium oxide ($RuO_x$), alloys thereof, a conductively-doped semiconductor material (e.g., conductively-doped silicon, conductively-doped germanium, conductively-doped silicon germanium, etc.), polysilicon, other materials exhibiting electrical conductivity, or combinations thereof. In some embodiments, the electrically conductive material comprises tungsten.

With continued reference to FIG. 1, a distance $D_1$ between a top portion of the source region 132 or the drain region 134 and a lowermost portion of the source region 132 or the drain region 134 may be referred to herein as a source depth or a drain depth. In some embodiments, the distance $D_1$ may be between about 20 nm and about 60 nm, such as between about 20 nm and about 30 nm, between about 30 nm and about 40 nm, between about 40 nm and about 50 nm, or between about 50 nm and about 60 nm. However, the disclosure is not limited to such depths of the source region 132 or the drain region 134.

A distance $D_2$ between an uppermost portion of the gate electrode 140 and a lowermost portion of the source region 132 and the drain region 134 may correspond to a height of the channel region 133 and may be referred to herein as a so-called "underlap" of the gate electrode 140 and each of the source region 132 and the drain region 134. In some embodiments, the distance $D_2$ may be between about 0 nm (e.g., about 0.1 nm) and about 10 nm, such as between about 0 nm and about 5 nm or between about 5 nm and about 10 nm. In other embodiments, the gate electrode 140 overlaps at least one of the source region 132 and the drain region 134 by between about 0 nm and about 10 nm, such as between about 0 nm and about 5 nm, or between about 5 nm and about 10 nm. By way of comparison, a conventional transistor may include an overlap of the gate electrode and the source region and the drain region of up to about 20 nm, which may result in an undesired about of current leakage through the transistor when the transistor is in the off-state.

In some embodiments, the distance $D_2$ between one of the gate electrode 140 and one of the source region 132 and the drain region 134 may be greater than the distance $D_2$ between the gate electrode 140 and the other of the source region 132 and the drain region 134. In some embodiments, the distance $D_2$ between the gate electrode 140 and the drain region 134 (connected to the memory storage element 120) may be greater than the distance $D_2$ between the gate electrode 140 and the source region 132. In some such embodiments, the transistor 130 may exhibit a reduced amount of leakage from the memory storage element 120 through the transistor 130 when the transistor is in the off-state because the drain region 134 is separated from the gate electrode 140 at least by the distance $D_2$.

Although the semiconductor device 100 has been described as including a transistor 130 comprising a SONOS structure, the disclosure is not so limited. In other embodiments, the transistor 130 comprises a so-called MONOS structure, wherein the gate electrode 140 comprises a metal (e.g., titanium, tungsten, titanium nitride, tungsten nitride, etc.). In yet other embodiments, the transistor 130 may comprise a so-called TANOS structure, wherein the gate electrode 140 comprises, for example, tantalum or tantalum nitride and the dielectric material 142 comprises, for example, aluminum oxide.

During use and operation of the semiconductor device 100, a voltage may be applied to the gate electrode 140 to induce an inversion layer in the channel region 133 and induce a current between the gate electrode 140 and at least one of the source region 132 and the drain region 134. An individual transistor 130 may be accessed by applying a voltage through a row associated with the transistor 130 (e.g., via the gate electrode 140), and applying a voltage associated with a column of the transistor 130 (e.g., for example, a bit line associated with, for example, the source region 132 through the electrically conductive material 150). Responsive to a sufficient voltage (e.g., a voltage having a magnitude greater than a threshold voltage), a current may flow in the channel regions 133 between the gate electrode 140 and each of the source region 132 and the drain region 134. Accordingly, the memory storage element 120 may be accessed through the transistor 130 responsive to exposure of the gate electrode 140 to the threshold voltage.

As the extent of underlap (i.e., the distance $D_2$; the distance between the gate electrode 140 and the drain region 134, for example) increases, the transistor 130 may exhibit a reduced amount of gate induced current leakage. As a result, the transistor 130 may exhibit improved refresh properties, since less charge may leak from the memory storage element 120 when the transistor 130 is in the off-state. In other words, when a charge associated with a logic state of the memory storage element 120 is stored in the memory storage element 120, the charge may not substantially leak through the channel region 133 since the drain region 134 and the memory storage element 120 are isolated by the distance $D_2$. In some such embodiments, the memory storage element 120 may retain a charge without exhibiting substantial refresh rates.

However, as the distance $D_2$ between the gate electrode 140 and each of the source region 132 and the drain region 134 increases, a resistance of the transistor 130 may increase. In other words, for the transistor 130 to operate in an on-state, the inversion layer may be induced across a greater distance. As such, for the same drive voltage applied to the gate electrode 140, the drive current of the transistor may be reduced (due to the larger resistance of the transistor 130). The reduced drive current may result in a longer data write time to the memory cell in between read and write operations of the memory cell associated with the transistor 130. Accordingly, the drive current of the transistor 130 may be inversely related to the refresh rate and the gate induced drain leakage of the transistor 130. For example, as the external resistance of the transistor increases (due to an increase in the distance of $D_2$), the gate-induced drain leakage of the transistor through the channel region 133 is reduced and the refresh rate of the associated memory cells is optimized. However, the higher external resistance of the transistor 130 may result in a reduced drive current of the transistor 130 when the transistor is in the on-state.

In some embodiments, the transistors 130 are formed with an underlap (e.g., a distance $D_2$ between the gate electrode 140 and at least one of the source region 132 and the drain region 134). The underlap may result in a reduced amount of leakage through the transistor 130 when the transistor is in the off-state.

After forming the semiconductor device 100, the semiconductor device 100 may be exposed to electrical testing (e.g., wafer probing) to test the refresh rates, data write time to the memory cell, drive current, gate induced drain leakage, and other electrical properties of memory cells 110 of the semiconductor device 100. In some embodiments, memory cells 110 exhibiting an insufficient drive current ($I_{on}$) may be identified, such as by applying a high gate voltage to the gate electrodes 140 of the transistors 130 and determining the transistors 130 (e.g., rows of transistors 130) exhibiting an insufficient drive current. In some embodiments, a relatively high voltage (e.g., a voltage greater than about 3.5 V, such as a voltage of about 3.75 V) may be applied to the gate electrodes 140 and while the drive current of the transistors 130 is measured.

After determining which transistors 130 or rows of transistors 130 in the array exhibit an insufficient drive current, charge may be stored to the charge trapping material 138 of such transistors to improve the drive current of such transistors 130. For example, charges trapped with the charge trapping material 138 (e.g., trapped holes, trapped electrons, etc.) may reduce a threshold voltage of the transistor 130 and may improve the drive current of the transistor 130.

Accordingly, in some embodiments, a charge may be stored (i.e., injected) in the charge trapping material 138 of the transistors 130 exhibiting a reduced drive current (i.e., failing the drive current testing during electrical testing of the semiconductor device 100). By way of nonlimiting example, the gate electrodes 140 of the memory cells 110 that exhibited the reduced drive current may be exposed to a relatively high voltage (referred to herein as a "programming current") to inject traps (e.g., holes, trapped holes) and store a charge within the charge trapping material 138. In some embodiments, during programming of such transistors 130, the substrate 102 may be unbiased (e.g., exposed to a voltage of about 0 V) while the gate electrodes 140 are exposed to the relatively high voltage. In some embodiments, the gate electrodes 140 of such transistors 130 are exposed to a voltage between about 4.0 V and about 5.0 V, such as between about 4.0 V and about 4.2 V, between about 4.2 V and about 4.4 V, between about 4.4 V and about 4.6 V, between about 4.6 V and about 4.8 V, or between about 4.8 V and about 5.0 V. Accordingly, a potential difference between the gate electrode 140 and the substrate 102 may be between about 4.0 V and about 5.0 V.

In some embodiments, the potential difference between the substrate 102 and the gate electrodes 140 may trap charges (hole traps, electron traps, etc.) within the charge trapping material 138 of such transistors 130. In other embodiments, electrons may be trapped within the charge trapping material 138. The stored charge within the charge trapping material 138 may reduce the threshold voltage of the transistors 130 and may increase the drive current of the memory cells 110 responsive to application of the same drive voltage to the gate electrode 140. In other words, the trapped charge may reduce the effective resistance of the transistor 130. Without wishing to be bound by any particular theory, it is believed that the trapped charge in the charge trapping material 138 reduces the effective underlap (distance $D_2$), effectively shortening the channel region 133 between the gate electrode 140 and each of the source region 132 and the drain region 134. Stated another way, the effective resistance of the transistor 130 is reduced due to the presence of the trapped charges within the charge trapping material 138. Accordingly, the operating drive current (i.e., $I_{on}$) of transistors 130 that failed the drive current testing may be shifted to a suitable drive current due to the presence of the trapped charge within the charge trapping material 138. The shifting of the drive current of such transistors 130 may be referred to herein as "programming" or "bit level trimming" of the transistors 130.

In some embodiments, the charge trapping material 138 proximate one of the source region 132 and the drain region 134 includes trapped charge (e.g., hole traps, electron traps) while the charge trapping material 138 proximate the other of the source region 132 and the drain region 134 does not substantially include trapped charge. In some embodiments, the charge trapping material 138 proximate the drain region 134 (electrically coupled to the memory storage element 120) may include trapped charges while the source region 132 is substantially free of trapped charges. In some embodiments, the charges may be trapped in only one of the source region 132 and the drain region 134 by applying a programming voltage (e.g., a voltage greater than about 4.0 V) to the gate electrode 140, applying a substantially 0 bias voltage to the substrate 102, and applying a voltage of substantially similar magnitude and direction as the programming voltage to the other of the source region 132 and the drain region 134. In some embodiments, hole traps may be formed by applying a programming voltage (e.g., a voltage greater than about 4.0 V) to the gate electrode 140. In other embodiments, hole traps may be formed by applying a negative programming voltage (e.g., a voltage less than about −3.0 V, such as less than about −4.0 V) to the gate electrode 140. In some such embodiments, the side of the transistor 130 proximate the memory storage element 120 (e.g., the drain region 134) may be floating (e.g., a current may not flow therethrough) and the electrically conductive material 150 may be biased to adjust an electric field and induce hole trapping.

The semiconductor device 100 including trapped charges in at least some of the charge trapping material 138 of at least some of the transistors 130 may exhibit a reduced number of memory cells 110 that fail either one of a refresh rate or a data write time to the memory cell and drive current test. Accordingly, the semiconductor device 100 may exhibit an improved yield compared to conventional semiconductor devices. The semiconductor device 100 may exhibit a sufficient margin between refresh rates and drive current.

Figure 2A:
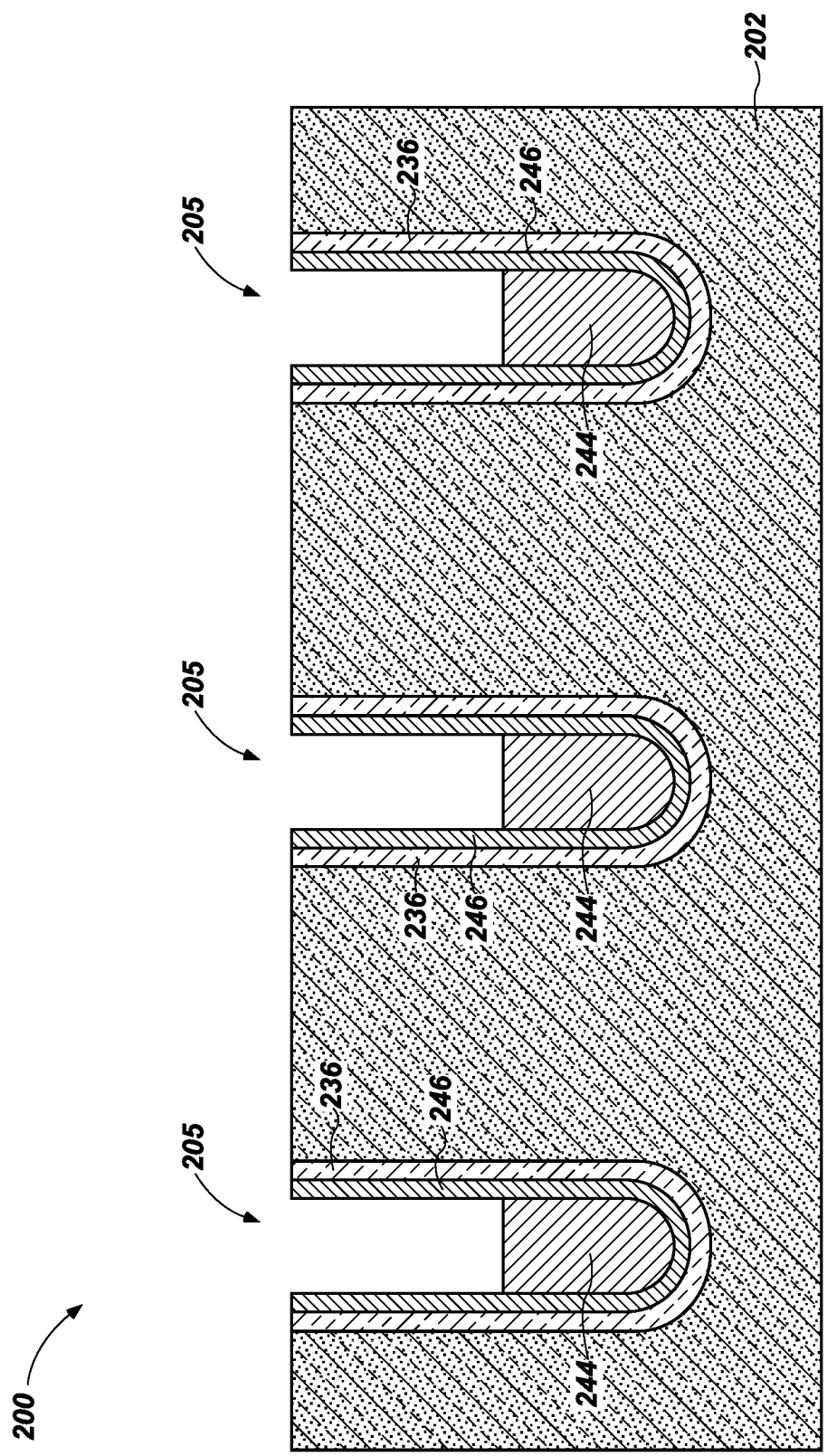
FIG. 2A through FIG. 2D are simplified cross-sectional views illustrating a method of forming a semiconductor device, in accordance with embodiments of the disclosure.

FIG. 2A through FIG. 2D illustrate a method of forming a semiconductor device, in accordance with embodiments of the disclosure. With reference to FIG. 2A, trenches (e.g., openings) 205 may be formed in a substrate 202. The substrate 202 may be substantially the same as the substrate 102 described above with reference to FIG. 1.

The trenches 205 may be formed to extend in a first direction (e.g., the direction into and out of the plane illustrated in FIG. 2A). The trenches 205 may be arranged in lines separated from each other in a second direction (e.g., left to right in the view illustrated in FIG. 2A), which may be different than the first direction. In some embodiments, the second direction is substantially perpendicular to the first direction.

In some embodiments, the trenches 205 may be lined with a dielectric material 236, which may be substantially similar to the dielectric material 136 described above with reference to FIG. 1. In some embodiments, the dielectric material 236 comprises silicon dioxide. The dielectric material 236 may be formed by, for example, atomic layer deposition (ALD), chemical vapor deposition (CVD), physical vapor deposition (PVD), plasma-enhanced chemical vapor deposition (PECVD), low pressure chemical vapor deposition (LPCVD), another deposition process, or combinations thereof. In some embodiments, the dielectric material 236 is formed by atomic layer deposition. The dielectric material 236 may be formed on sidewalls and over the top surface of the substrate 202.

After formation of the dielectric material 236, a barrier material 246 may be formed over surfaces of the dielectric material 236. The barrier material 246 may overlie surfaces of the dielectric material 236 within the trench 205 and over the top surface of the substrate 202. The barrier material 246 may be substantially the same as the barrier material 146 described above with reference to FIG. 1. In some embodiments, the barrier material 246 comprises titanium nitride.

The barrier material 246 may be formed by, for example, ALD, CVD, PVD, PECVD, LPCVD, another deposition method, or combinations thereof. In some embodiments, the barrier material 246 is formed by PVD.

In some embodiments, after formation of the barrier material 246, a conductive material 244 may be formed within at least a lower portion of the trenches 205. The conductive material 244 may be substantially the same as the conductive material 144 described above with reference to FIG. 1. In some embodiments, the conductive material 244 comprises tungsten.

After forming the conductive material 244, a portion of the conductive material 244 may be removed from upper surfaces of the semiconductor device 200 and from upper portions of the trenches 205. Accordingly, an upper exposed surface of the conductive material 244 may be recessed within the trenches 205 (e.g., located below an upper surface of the substrate 202).

The barrier material 246 and the dielectric material 236 may be removed from exposed surfaces of the substrate 202, such as by chemical mechanical planarization (CMP). In some such embodiments, the dielectric material 236 may be located substantially only on sidewalls and lower surfaces of the trenches 205 and the barrier material 246 may be located substantially only on surfaces of the dielectric material 236. In other words, the barrier material 246 and the dielectric material 236 may not substantially be located on upper surfaces of the substrate 202.

Figure 2B:
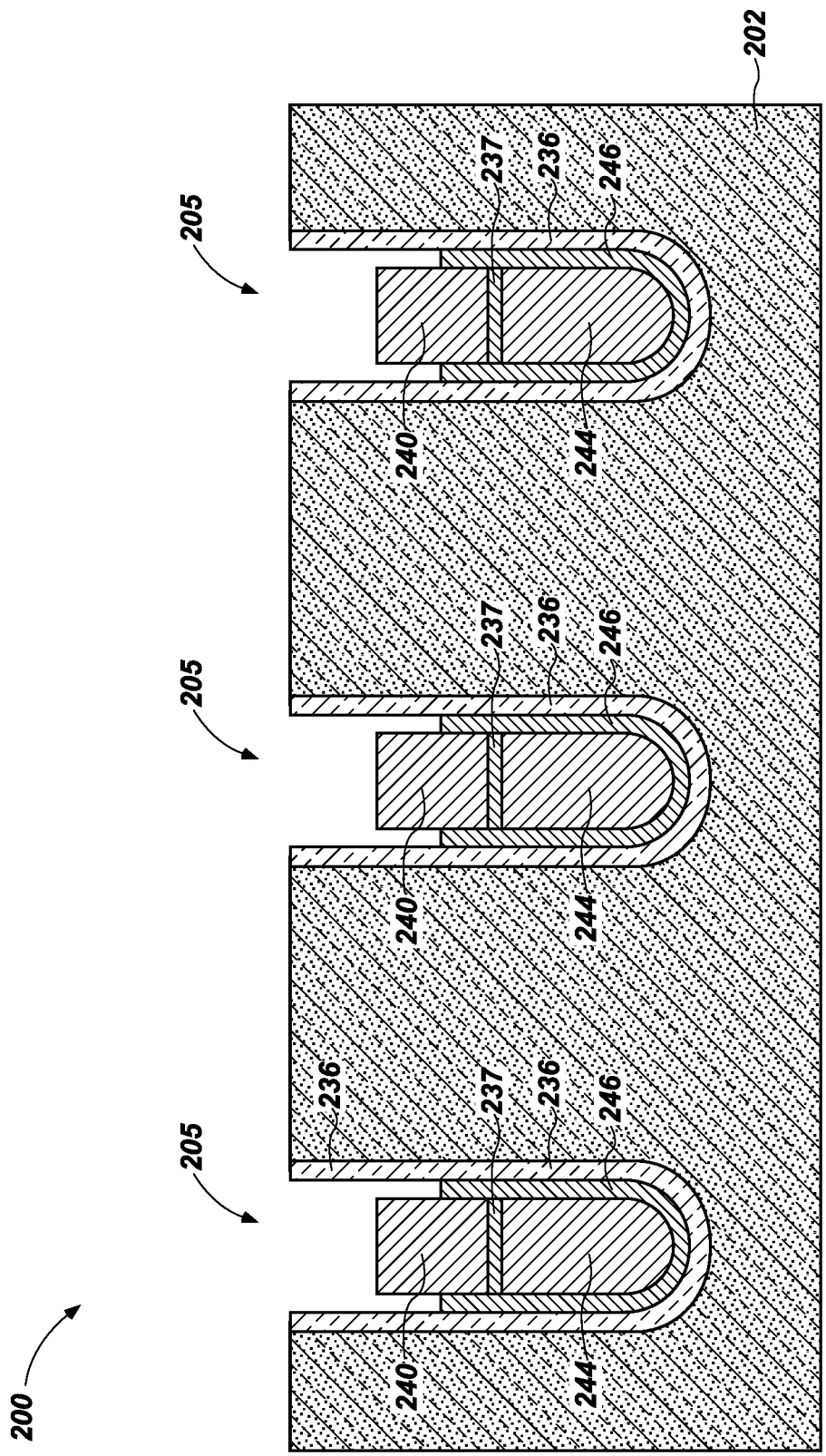

With reference to FIG. 2B, another barrier material 237 may be formed over exposed surfaces of the conductive material 244. The another barrier material 237 may comprise the same material as the barrier material 246 and may, therefore, form a substantially continuous composition with the barrier material 246. In some embodiments, the another barrier material 237 is formed over the conductive material 244 by PVD and comprises titanium nitride.

After forming the another barrier material 237, a gate electrode material 240 may be formed over the another barrier material 237. The gate electrode material 240 may be substantially the same material as the gate electrode 140 described above with reference to FIG. 1. The gate electrode material 240 may be formed by ALD, CVD, PVD, LPCVD, PECVD, another deposition method, or combinations thereof.

With continued reference to FIG. 2B, after forming the gate electrode material 240, portions of the barrier material 246 may be removed, such as by exposing the semiconductor device 200 to one or more etch chemistries formulated and configured to remove a portion of the barrier material 246 without substantially removing the gate electrode material 240 or the dielectric material 246. Removal of the portions of the barrier material 246 may expose at least an upper portion of the gate electrode material 240.

Figure 2C:
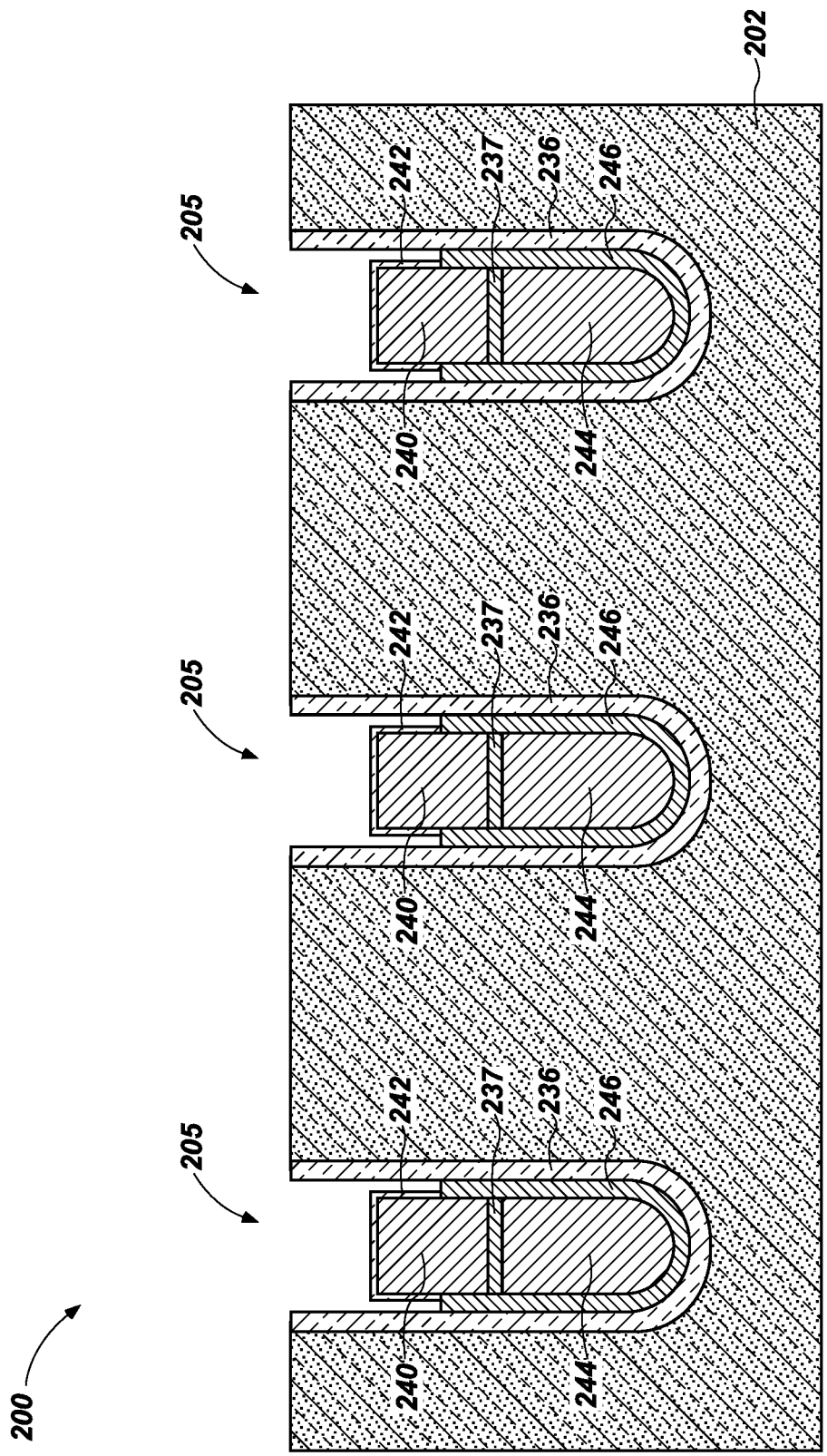

With reference to FIG. 2C, after removing at least a portion of the barrier material 236, exposed surfaces of the gate electrode material 240 (e.g., an upper horizontal portion and upper portions of the sidewalls of the gate electrode material 240) may be oxidized to form a dielectric material 242 over the sidewalls and a top surface of the gate electrode material 240. By way of nonlimiting example, the semiconductor device 200 may be exposed to oxidizing conditions, such as to thermal oxidation conditions. In some embodiments, exposed portions of the gate electrode material 240 may be oxidized without substantially oxidizing exposed portions of the barrier material 246. The dielectric material 242 may be substantially the same as the dielectric material 142 described above with reference to FIG. 1.

Figure 2D:
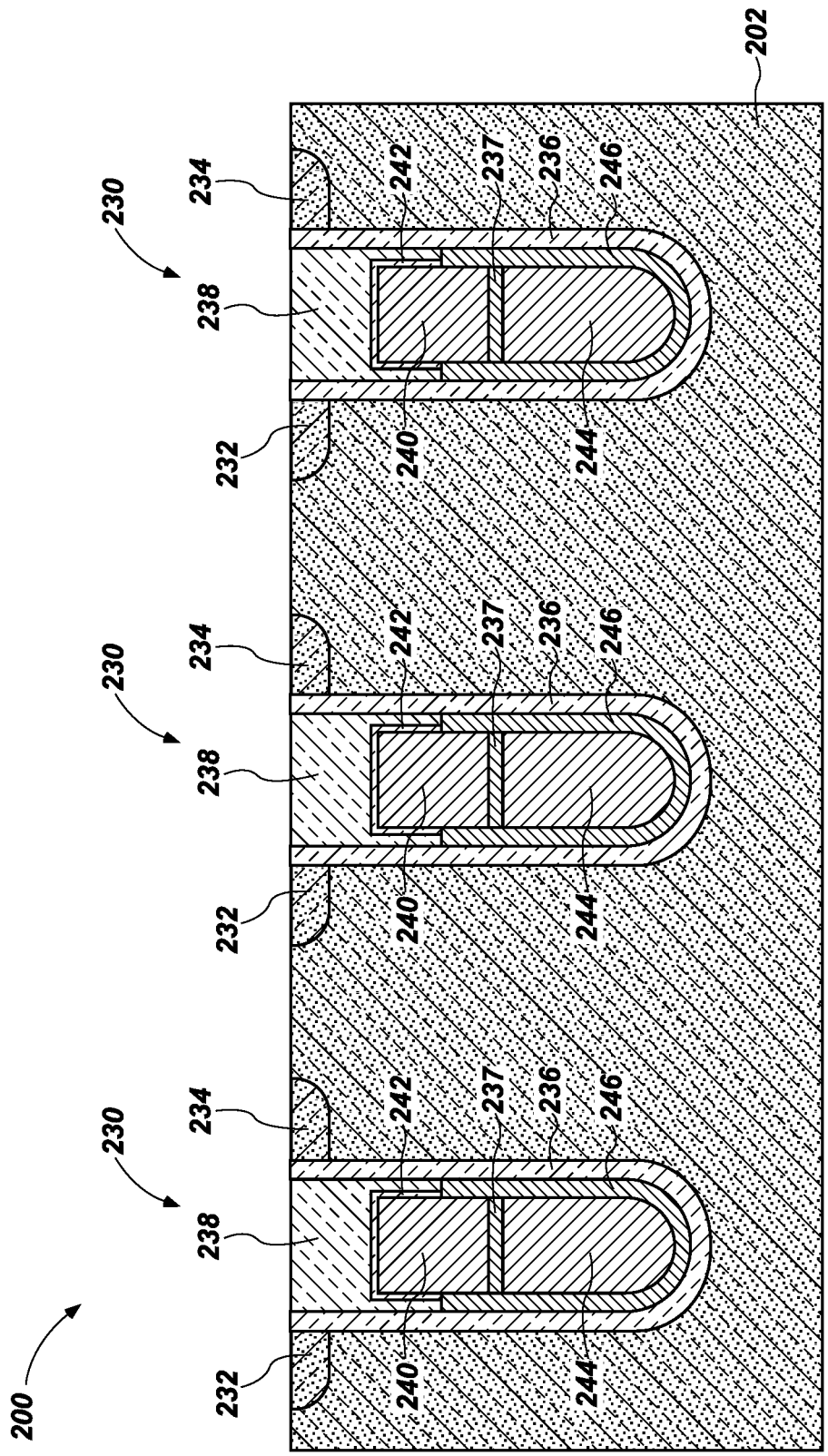

Referring to FIG. 2D, after forming the dielectric material 242, a charge trapping material 238 may be formed over surfaces of the dielectric material 242 and the dielectric material 246 within the trenches 205. The charge trapping material 238 may comprise the same materials described above with reference to the charge trapping material 138. After forming the charge trapping material 238, the semiconductor device 200 may be exposed to an abrasive planarization process, such as chemical mechanical planarization process to substantially planarize an upper surface of the semiconductor device 200.

After forming the charge trapping material 238, in some embodiments, portions of the substrate 202 may be doped with one or more impurities to form respective source regions 232 and drain regions 234, which may be substantially the same as the source regions 132 and the drain regions 134 described above with reference to FIG. 1.

In some embodiments, the semiconductor device 200 may be patterned in the second direction to isolate individual transistors in the second direction. By way of nonlimiting example, trenches may be formed in the second direction and filled with an electrically insulative material to form isolated transistors 230 arranged in rows extending in the first direction and columns extending in the second direction.

In some embodiments, conductive contacts may be formed to each of the source regions 232 and the drain regions 234. A memory storage element may be formed in electrical communication with, for example, the drain regions 234, as described above with reference to FIG. 1.

The transistors 230 may be tested and programmed by trapping a charge (e.g., trapping holes, trapping electrons) in the charge trapping material 238 of at least some of the transistors, as described above with reference to FIG. 1. By way of nonlimiting example, transistors 230 exhibiting a low drive current and a high data write time to the memory cell during electrical testing of the semiconductor device 200 may be programmed by applying a programming voltage to the gate electrode material 240 of such transistors and a substantially zero (0) bias to the substrate 202 to trap charges (e.g., trap holes) within the charge trapping material 238. The programmed transistors may exhibit an improved drive current without substantially negatively effective the refresh rate thereof. Accordingly, transistors that failed a data write time to the memory cell and drive current test may be programmed and configured to operate in the semiconductor device 200.

Figure 3:
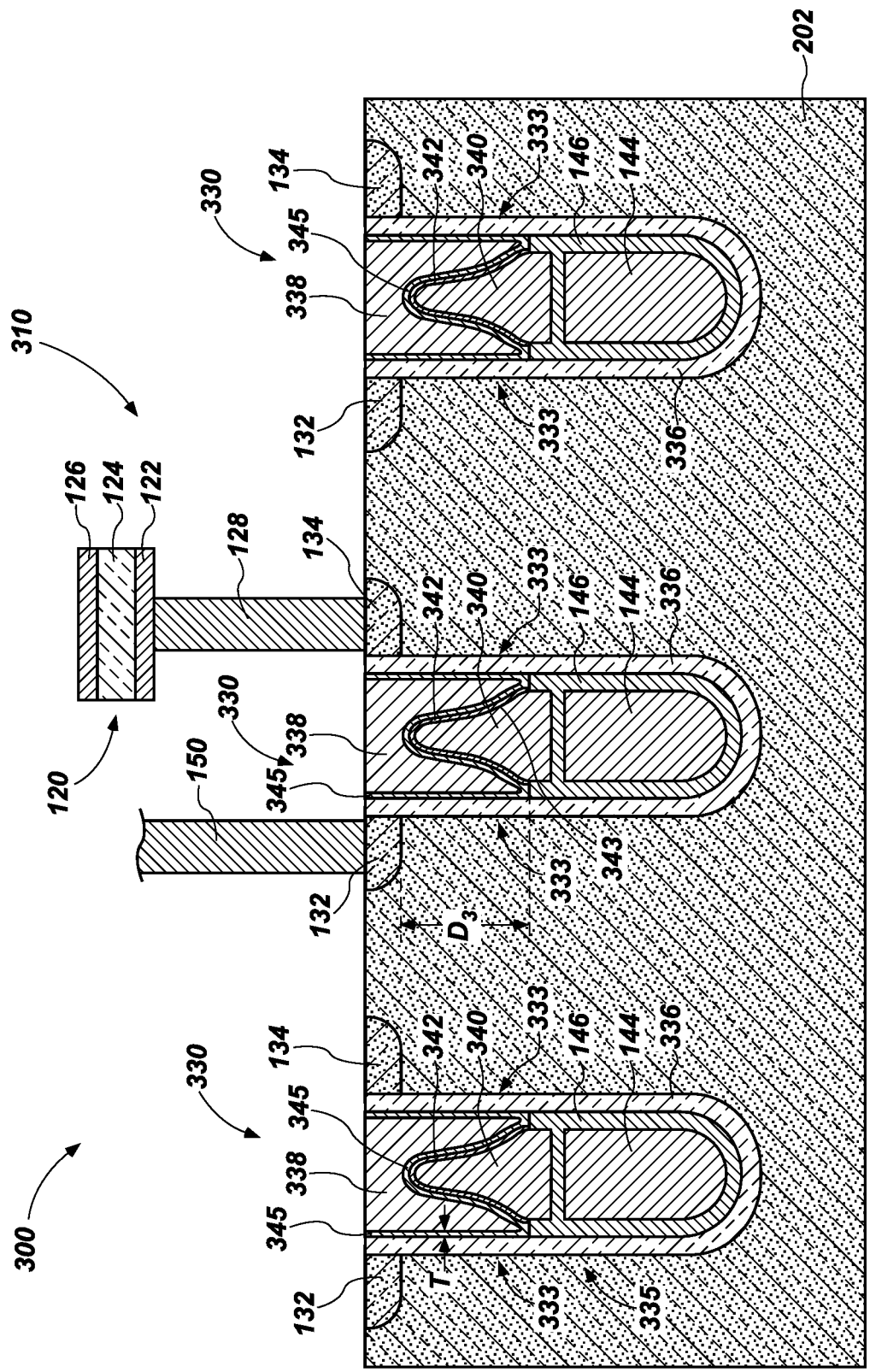
FIG. 3 is a simplified cross-sectional view of a semiconductor device, in accordance with embodiments of the disclosure.

FIG. 3 is a simplified cross-sectional view of a semiconductor device 300, in accordance with embodiments of the disclosure. The semiconductor device 300 may be substantially similar to the semiconductor device 100 described above with reference to FIG. 1, except that the semiconductor device 300 may include transistors 330 having a different structure and configuration than the transistors 130. Elements that are substantially the same between FIG. 1 and FIG. 3 may retain the same numerical designation herein.

The semiconductor device 300 may include transistors 330 formed within the substrate 202. The transistors 330 may include the source region 132 and the drain region 134, with a gate electrode 340 located between the source region 132 and the drain region 134. A channel region 333 may be formed between the gate electrode 340 and the source region 132 and between the gate electrode 340 and the drain region 134 responsive to application of a suitable voltage (e.g., a voltage greater than a threshold voltage, $V_t$) to the gate electrode 340.

In some embodiments, the transistor 330 comprises a lateral transistor, wherein the source region 132 and the drain region 134 are located laterally adjacent to each other and at substantially the same distance from the substrate 202. In other embodiments, the transistor 330 may comprise a so-called vertical transistor, wherein one of the source region 132 and the drain region 134 overlies the other of the source region 132 and the drain region 134, the channel region 333 vertically between the source region 132 and the drain region 134.

The gate electrode 340 may include the same materials described above with reference to the gate electrode 140. In some embodiments, the gate electrode 340 comprises polysilicon. In some such embodiments, the gate electrode 340 may be doped with one or more dopants (e.g., P-type dopants).

The gate electrode 340 may exhibit tapered or arcuate sidewalls 343. In some embodiments, a distance between opposing sidewalls 343 may be greater at a lower portion of the gate electrode 340 than a distance between opposing sidewalls 343 at an upper portion of the gate electrode 340.

A dielectric material 336 (which may be referred to herein as a "tunnel dielectric" or a "tunnel oxide") may overlie sidewalls of openings 335 within the substrate 202. The dielectric material 336 may be substantially the same as the dielectric material 136 described above with reference to FIG. 1. In some embodiments, the dielectric material 336 comprises silicon dioxide.

A dielectric material 342 (which may be referred to herein as a "gate dielectric," a "blocking dielectric," or a "blocking oxide") may overlie portions of the gate electrode 340. The dielectric material 342 may comprise the same materials described above with reference to the dielectric material 142. In some embodiments, the dielectric material 342 comprises silicon dioxide. In some embodiments, the dielectric material 342 comprises an oxide of the gate electrode 340. By way of nonlimiting example, the gate electrode 340 may comprise polysilicon and the dielectric material 342 may comprise silicon dioxide.

Another dielectric material 345 may overlie portions of the dielectric material 336 and portions of the dielectric material 342. The another dielectric material 345 may comprise the same materials described above with reference to the dielectric material 336. In some embodiments, the another dielectric material 345 comprises silicon dioxide. In some embodiments, the another dielectric material 345 comprises a low temperature oxide (e.g., an oxide deposited at a low temperature, such as below about 25° C., below about 0° C., etc.). In some such embodiments, the another dielectric material 345 may have a lower density than the dielectric material 336, even when, for example, the another dielectric material 345 and the dielectric material 336 comprise the same material (e.g., silicon dioxide).

A charge trapping material 338 may overlie at least a portion of the another dielectric material 345. The charge trapping material 338 may be formulated and configured to trap a charge therein, as will be described herein. The charge trapping material 338 may comprise the same materials described above with reference to FIG. 1. In some embodiments, the charge trapping material 338 comprise silicon nitride.

A distance $D_4$ between a surface of the gate electrode 340 and the dielectric material 336 may vary along a vertical length (i.e., up and down in the view illustrated in FIG. 3) of the gate electrode 340. In some embodiments, the distance $D_4$ may be greater at an upper portion of the gate electrode 340. In some such embodiments, during use and operation of the transistor 330, an inversion layer at the channel region 333 may begin to form proximate the lower portion of the gate electrode 340, where the distance $D_4$ between the gate electrode 340 and the dielectric material 336 is lower than along other portions of the gate electrode 340.

In some embodiments, the distance $D_4$ may exhibit a gradient along a length of the gate electrode 340. By way of nonlimiting example, in some embodiments, the distance $D_4$ may be between about 2 nm and about 3 nm proximate the lower portion of the gate electrode 340 and may be between about 4 nm and about 5 nm proximate the upper portion of the gate electrode 340. In some embodiments, a ratio of $D_4$ at the upper portion of the gate electrode 340 to $D_4$ at the lower portion of the gate electrode 340 may be between about 1.5:1.0 and about 2.5:1.0, such as between about 1.5:1.0 and about 1.75:1.0, between about 1.75:1.0 and about 2.0:1.0, between about 2.0:1.0 and about 2.25:1.0, or between about 2.25:1.0 and about 2.5:1.0.

In some embodiments, a distance $D_3$ between a lower portion of the source region 132 and the lower portion of the dielectric material 342 may correspond to a height of the channel region 333 and may be referred to herein as the underlap of the gate electrode 340 with each of the source region 132 and the drain region 134. In some embodiments, the distance $D_3$ may be between about 0 nm (e.g., about 0.1 nm) and about 10 nm, such as between about 0 nm and about 5 nm or between about 5 nm and about 10 nm. In other embodiments, the gate electrode 340 overlaps at least one of the source region 132 and the drain region 134 by between about 0 nm and about 10 nm, such as between about 0 nm and about 5 nm, or between about 5 nm and about 10 nm.

A thickness $T_2$ of the another dielectric material 345 may be between about 2 nm and about 6 nm of silicon dioxide. In other words, the equivalent oxide thickness (EOT) of the another dielectric material 345 may be between about 2 nm and about 6 nm, such as between about 2 nm and about 4 nm or between about 4 nm and about 6 nm. It is believed that a sufficient EOT may facilitate retention of charges trapped within the charge trapping material 338 during use and operation of the memory cell 310. In other words, the thickness of the another dielectric material 345 may reduce or prevent hole detrapping or charge loss of the charge trapping material 338 through the another dielectric material 345.

In some embodiments, the charge trapping material 338 of at least some of the transistors 330 may include more trapped charge than the charge trapping material 338 of other transistors 330. For example, and as described above, the gate electrodes 340 of transistors 330 exhibiting a low drive current during electrical testing of the semiconductor device 300 may be exposed to a sufficiently high voltage (e.g., a voltage greater than about 4.0 V) to trap charges in the charge trapping material 338. In some such embodiments, one or more rows of transistors 330 may include transistors 330 including charge trapping material 338 having more stored charge than the charge trapping material of other rows of transistors 330.

In some embodiments, the transistors 330 including the gate electrodes 340 having the arcuate sidewalls 343 may facilitate a greater area of the charge trapping material 338 than if the gate electrodes 340 did not include the arcuate sidewalls 343. Accordingly, the transistors 330 may be configured to trap more charge (include a greater number of hole traps, a greater number of electron traps, etc.) than if the sidewalls of the gate electrodes 340 were substantially vertical.

Figure 4A:
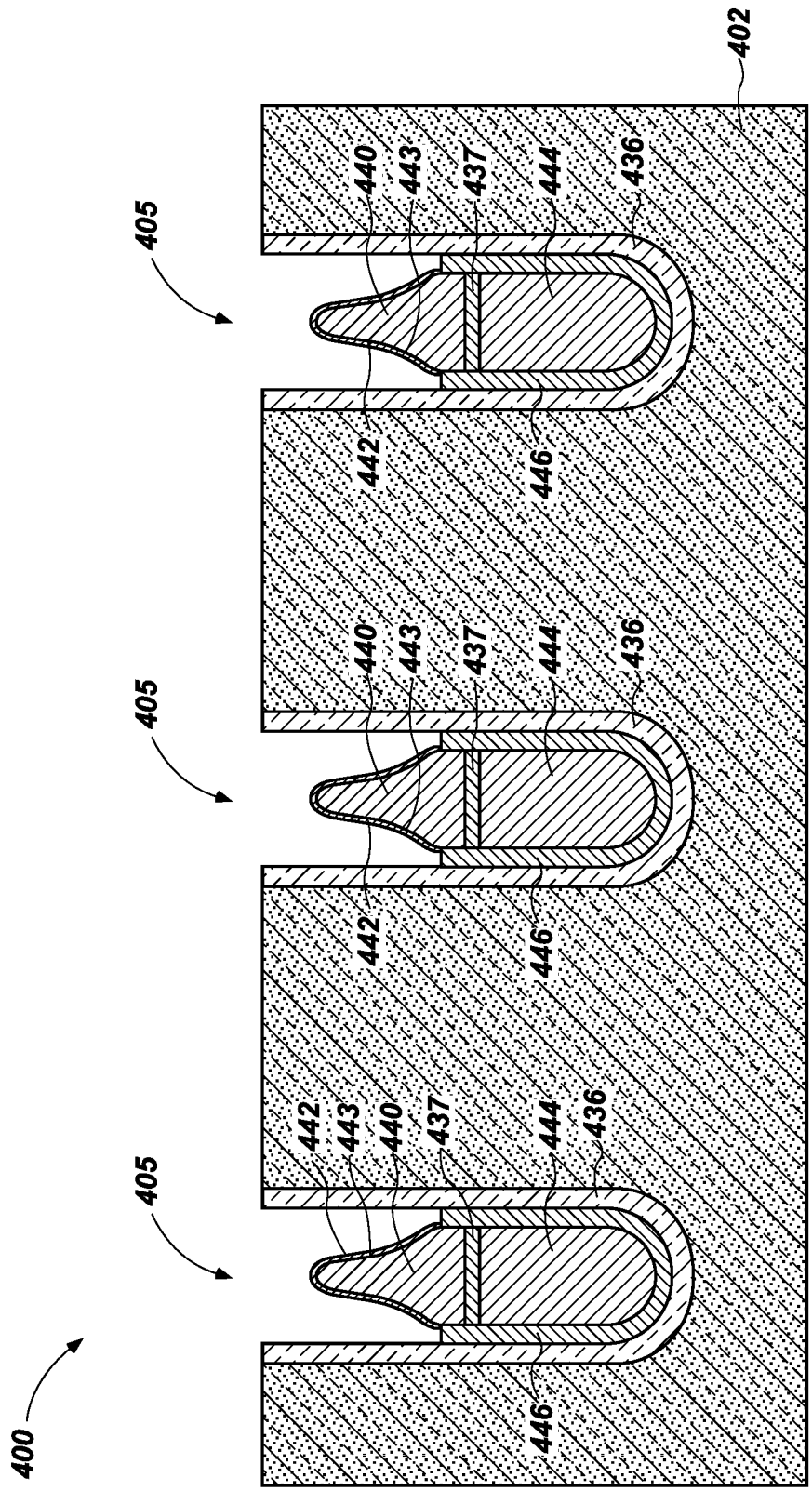
FIG. 4A and FIG. 4B are simplified cross-sectional views illustrating a method of forming a semiconductor device, in accordance with embodiments of the disclosure.
Figure 4B:
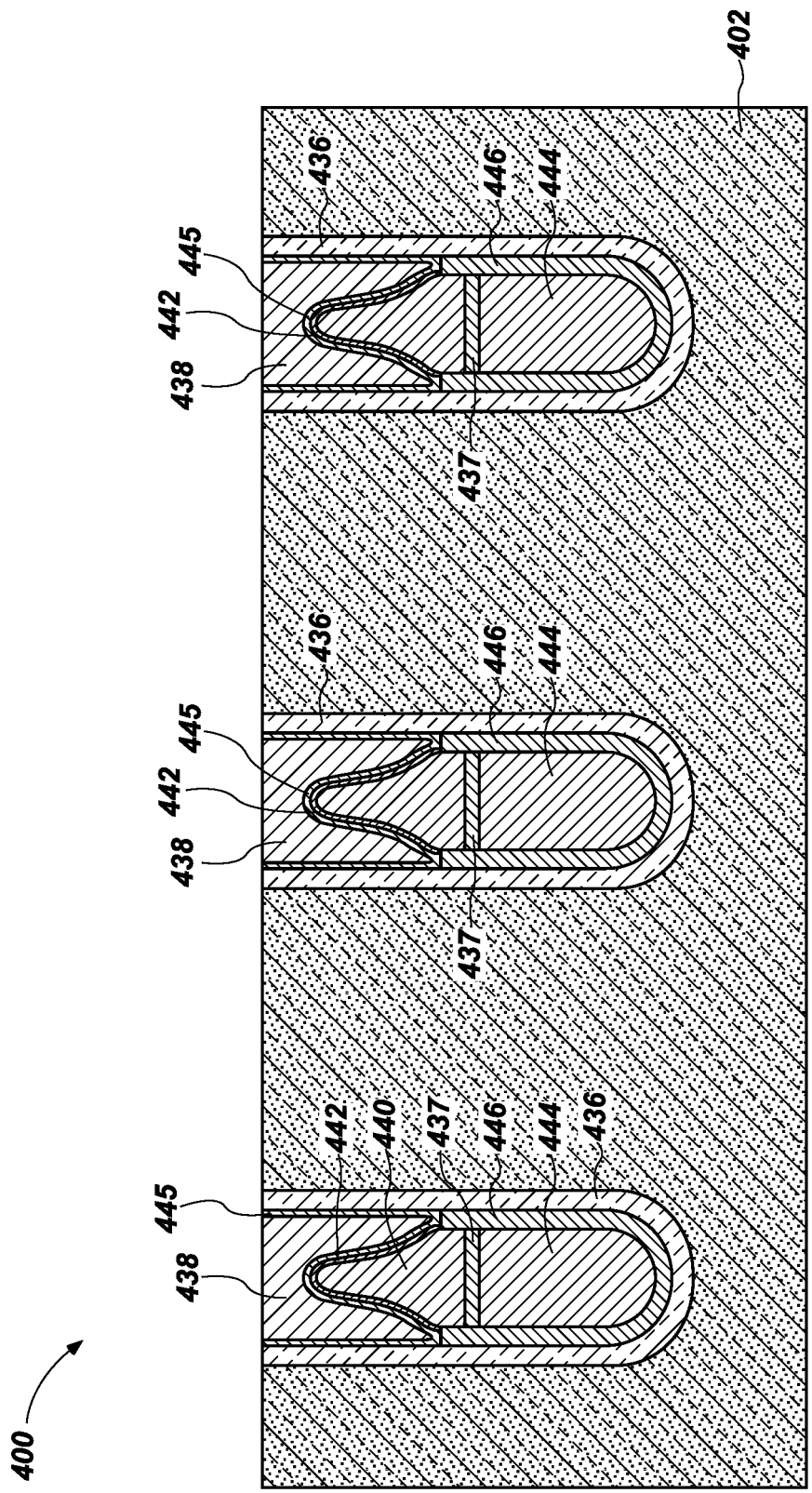

FIG. 4A and FIG. 4B illustrate a method of forming a semiconductor device, in accordance with embodiments of the disclosure. With reference to FIG. 4A, a semiconductor device 400 may be formed as described above with reference to FIG. 2A and FIG. 2B.

With reference to FIG. 4A, the semiconductor device 400 may include trenches (e.g., openings) 405 formed in a substrate 402, a dielectric material 436 over sidewalls of the trenches 405, a barrier material 446 over sides of the dielectric material 436, a conductive material 444 in a lower portion of the trenches 405, a barrier material 437 over the conductive material 444, and a gate electrode material 440 over the barrier material 437. A portion of the gate electrode material 440 may be located between opposing portions of the barrier material 436. The substrate 402, the dielectric material 436, the barrier material 436, the conductive material 444, the barrier material 437, and the gate electrode material 440 may comprise the same materials described above with reference to the substrate 202, the dielectric material 236, the barrier material 246, the conductive material 244, the barrier material 237, and the gate electrode material 240.

With continued reference to FIG. 4A, portions of the gate electrode material 440 may be removed to form arcuate sidewalls 443 of the gate electrode material 440. In some embodiments, removing portions of the gate electrode material 440 may include exposing portions of the gate electrode material 440 to oxidizing conditions and removing at least some oxidized portions of the gate electrode material 440. In some embodiments, the gate electrode material 440 is exposed to thermal oxidation conditions and subsequently exposed to a wet stripping chemistry formulated and configured to remove oxides of the gate electrode material 440, such as, for example, hydrofluoric acid. In other embodiments, exposed portions of the oxidized gate electrode material 440 may be exposed to a plasma, such as a plasma including $SF_6$, $NF_3$, $CF_4$, $CHF_3$, $C_2F_6$, $C_5F_8$, another etching material, or combinations thereof.

In some embodiments, a dielectric material 442 may overlie exposed portions of the gate electrode material 440. The dielectric material 442 may comprise an oxide of the gate electrode material 440. In some embodiments, a thickness of the electrode material 442 may be between about 20 Å and about 30 Å, such as between about 20 Å and about 25 Å or between about 25 Å and about 30 Å. However, the disclosure is not so limited to such thicknesses of the dielectric material 442.

Referring to FIG. 4B, a dielectric material 445 may be formed over the dielectric material 442 and over sidewalls of the dielectric material 446. The another dielectric material 445 may include the same materials described above with reference to the another dielectric material 345. In some embodiments, the another dielectric material 445 comprises silicon dioxide.

The another dielectric material 445 may be formed by, for example, ALD, CVD, PVD, LPCVD, PECVD, another deposition process, or combinations thereof. In some embodiments, the another dielectric material 445 is formed by ALD. In some embodiments, the another dielectric material 445 is substantially conformally formed over the dielectric material 445.

After forming the another dielectric material 445, a charge trapping material 438 is formed over surfaces of the another dielectric material 445 and substantially fills the trenches 405 (FIG. 4A). The charge trapping material 338 may comprise the same materials described above with reference to the charge trapping material 338. In some embodiments, the charge trapping material comprises silicon nitride.

After forming the another dielectric material 445 and the charge trapping material 438, any of the another dielectric material 445 and the charge trapping material 438 on upper surfaces of the semiconductor device 400 (e.g., not within the trenches 405 (FIG. 4A)) may be removed, such as by performing a CMP process on the semiconductor device 400.

Source regions and drain regions may be formed within the substrate 402 to form transistors, as described above with reference to FIG. 3.

In some embodiments, trenches may be formed in a second direction through, for example, at least a portion of the charge trapping material 438, at least a portion of the another dielectric material 445, at least a portion of the dielectric material 446, at least a portion of the dielectric material 442, and at least a portion of the gate electrode material 440. The trenches may be filled with an electrically insulative material to isolate at least the source regions and the drain regions of adjacent transistors.

The semiconductor device 400 may be completed by, for example forming a memory storage component in electrical communication with, for example, the drain regions of the transistors and forming an electrically conductive material in electrical communication with, for example, the source regions, as described above with reference to FIG. 3.

The charge trapping material 438 of at least some of the transistors trap more charge than the charge trapping material 438 of at least other transistors of the semiconductor device, as described above.

Accordingly, in at least some embodiments a semiconductor device comprises a memory storage component and a transistor in operable communication with the memory storage component. The transistor comprises a source region, a drain region, a gate electrode between the source region and the drain region, a charge trapping material surrounding at least an upper portion of the gate electrode, and an oxide material on sides of the charge trapping material.

Accordingly, in at least some embodiments, a method of forming a semiconductor device comprises forming a dielectric material on sidewalls of trenches in a semiconductive material, forming a gate electrode material within the trenches, forming an oxide material over at least a portion of the sidewalls and over an upper surface of the gate electrode material, forming a charge trapping material in contact with the oxide material and the dielectric material, forming a source region and a drain region on opposing sides of the trenches, and forming a memory storage element in operable communication with one of the source region and the drain region.

In some embodiments, the semiconductor device comprises a DRAM semiconductor device including a SONOS-type non-volatile memory cell integrated for charge trapping to tailor the leakage performance (e.g., drain induced drain leakage) of the transistor and a drive current of the transistor. Holes may be trapped in the charge trapping material of the transistors through the word lines (gate electrodes) thereof to selectively adjust the performance of each memory cell and associated transistor.

Figure 5:
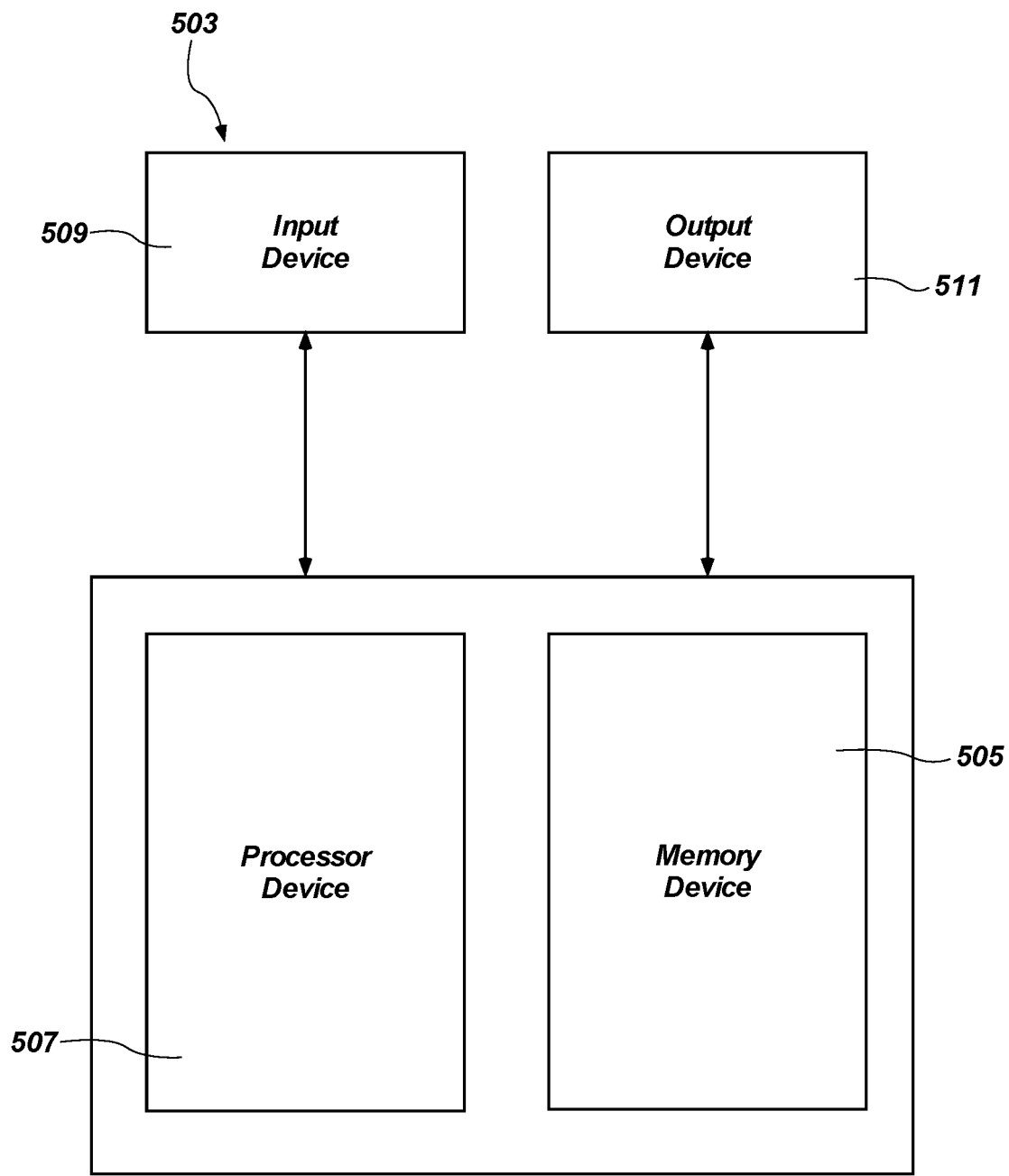
FIG. 5 is a schematic block diagram of an electronic system, in accordance with an embodiment of the disclosure.

Semiconductor devices (e.g., the semiconductor devices 100, 200, 300, 400) including transistors (e.g., the transistors 130, 230, 330) in accordance with embodiments of the disclosure may be used in embodiments of electronic systems of the disclosure. For example, FIG. 5 is a block diagram of an illustrative electronic system 503 according to embodiments of disclosure. The electronic system 503 may comprise, for example, a computer or computer hardware component, a server or other networking hardware component, a cellular telephone, a digital camera, a personal digital assistant (PDA), portable media (e.g., music) player, a Wi-Fi or cellular-enabled tablet such as, for example, an iPAD® or SURFACE® tablet, an electronic book, a navigation device, etc. The electronic system 503 includes at least one memory device 505. The memory device 505 may include, for example, an embodiment of a semiconductor device previously described herein (e.g., semiconductor devices 100, 200, 300, 400) including transistors (e.g., transistors 130, 230, 330) including a charge trapping material (e.g., the charge trapping material 138, 238, 338, 438), wherein the charge trapping material of at least some of the transistors includes substantially more trapped charge than the charge trapping material of at least other of the transistors in the semiconductor device.

The electronic system 503 may further include at least one electronic signal processor device 507 (often referred to as a "microprocessor"). The electronic signal processor device 507 may, optionally, include an embodiment of a semiconductor device previously described herein (e.g., the semiconductor devices 100, 200, 300, 400). The electronic system 503 may further include one or more input devices 509 for inputting information into the electronic system 503 by a user, such as, for example, a mouse or other pointing device, a keyboard, a touchpad, a button, or a control panel. The electronic system 503 may further include one or more output devices 511 for outputting information (e.g., visual or audio output) to a user such as, for example, a monitor, a display, a printer, an audio output jack, a speaker, etc. In some embodiments, the input device 509 and the output device 511 may comprise a single touchscreen device that can be used both to input information to the electronic system 503 and to output visual information to a user. The input device 509 and the output device 511 may communicate electrically with one or more of the memory device 505 and the electronic signal processor device 507. In some embodiments, more than one function may be performed by a single semiconductor die, for example in the case of a system on a chip (SoC), wherein processor and memory functions are incorporated in a single die.

Thus, in accordance with embodiments of the disclosure, a system comprises at least one processor device operably coupled to at least one input device and at least one output device, and a semiconductor device operably coupled to the at least one processor device. The semiconductor device comprises at least one memory cell comprising a memory storage element and a transistor. The transistor comprises a gate electrode within a base material, an oxide material over at least a portion of the gate electrode, a charge trapping material over the oxide material, another oxide material over sides of the charge trapping material, and a source region and a drain region on opposing sides of the gate electrode.

While certain illustrative embodiments have been described in connection with the figures, those of ordinary skill in the art will recognize and appreciate that embodiments encompassed by the disclosure are not limited to those embodiments explicitly shown and described herein. Rather, many additions, deletions, and modifications to the embodiments described herein may be made without departing from the scope of embodiments encompassed by the disclosure, such as those hereinafter claimed, including legal equivalents. In addition, features from one disclosed embodiment may be combined with features of another disclosed embodiment while still being encompassed within the scope of the disclosure.

What is claimed is:

1. A semiconductor device, comprising:
   a memory storage component; and
   a transistor in operable communication with the memory storage component, the transistor comprising:
   a source region, a drain region, and a gate electrode between the source region and the drain region;
   a charge trapping material surrounding at least an upper portion of vertically extending sidewalls of the gate electrode;
   an oxide material on sides of the charge trapping material; and
   another oxide material over at least a portion of the gate electrode, the another oxide material between the vertically extending sidewalls of the gate electrode and the charge trapping material and separating the charge trapping material from the gate electrode.

2. The semiconductor device of claim 1, further comprising an array of transistors, wherein at least one transistor of the array of transistors comprises a greater density of trapped holes than other transistors of the array of transistors.

3. The semiconductor device of claim 2, wherein the array of transistors comprises rows of transistors, wherein the at least one transistor is located in at least one row of the array of transistors comprising a greater density of trapped holes than transistors of other rows of transistors.

4. The semiconductor device of claim 1, wherein the charge trapping material comprise silicon nitride.

5. The semiconductor device of claim 1, wherein the gate electrode comprises polysilicon.

6. The semiconductor device of claim 1, wherein:
the source region and the drain region are laterally offset from each other; and
the gate electrode is vertically offset from the source region and the drain region.

7. The semiconductor device of claim 1, wherein the memory storage component comprises a capacitor.

8. The semiconductor device of claim 1, wherein the oxide material comprises silicon dioxide, the gate electrode comprises polysilicon, and the charge trapping material comprises silicon nitride.

9. The semiconductor device of claim 1, wherein the gate electrode comprises arcuate sidewalls.

10. The semiconductor device of claim 1, wherein a lateral distance between the gate electrode and the oxide material varies along a vertical dimension of the gate electrode.

11. A method of forming a semiconductor device, the method comprising:
forming an oxide material on sidewalls of trenches in a semiconductive material;
forming a gate electrode material within the trenches;
forming another oxide material over at least a portion of the gate electrode material;
forming a charge trapping material in contact with the oxide material and the another oxide material, the charge trapping material surrounding at least an upper portion of vertically extending sidewalls of the gate electrode, the another oxide material between the vertically extending sidewalls of the gate electrode and the charge trapping material and separating the charge trapping material from the gate electrode;
forming a source region and a drain region on opposing sides of the trenches to form a transistor, the gate electrode between the source region and the drain region; and
forming a memory storage component in operable communication with the transistor.

12. The method of claim 11, further comprising trapping a charge in the charge trapping material located within some of the trenches.

13. The method of claim 12, wherein trapping a charge in the charge trapping material comprises exposing the gate electrode material associated with the charge trapping material to a voltage between about 4.0 V and about 5.0 V.

14. The method of claim 11, wherein forming a gate electrode comprises forming a gate electrode comprising doped polysilicon within the trenches.

15. The method of claim 11, wherein forming a charge trapping material comprises forming the charge trapping material comprising silicon nitride.

16. The method of claim 11, wherein forming a memory storage component comprises forming a capacitor.

17. The method of claim 11, wherein forming another oxide material comprises forming the another oxide material at a temperature below about 25° C.

18. The method of claim 11, further comprising removing at least a portion of the gate electrode material to form a gate electrode material comprising arcuate sides.

19. A system, comprising:
at least one processor device operably coupled to at least one input device and at least one output device; and
a semiconductor device operably coupled to the at least one processor device, the semiconductor device comprising at least one memory cell comprising:
a memory storage element; and
a transistor, the transistor comprising:
a gate electrode within a base material;
an oxide material over at least a portion of the gate electrode;
a charge trapping material over the oxide material;
another oxide material over sides of the charge trapping material, the charge trapping material directly contacting the another oxide material and the oxide material, the charge trapping material separated from the gate electrode by the oxide material; and
a source region and a drain region on opposing sides of the gate electrode.

20. The system of claim 19, wherein a distance between the gate electrode and the another oxide material varies along a length of the gate electrode.

21. The system of claim 19, wherein a maximum distance between the gate electrode and the another oxide material is between about 5 nm and about 6 nm.

22. The system of claim 19, wherein the oxide material exhibits a greater density than a density of the another oxide material.

23. The system of claim 19, wherein the gate electrode comprises polysilicon, the oxide material comprises silicon dioxide, the charge trapping material comprises silicon nitride, and the another oxide material comprises silicon dioxide.

24. The system of claim 19, wherein the source region, the oxide material, the charge trapping material, the another oxide material, and the gate electrode comprise a SONOS structure.

25. The semiconductor device of claim 1, wherein the gate electrode is disposed in an upper portion of the transistor.

26. A semiconductor device, comprising:
a memory storage component; and
an array of transistors, at least one transistor of the array of transistors in operable communication with the memory storage component, the at least one transistor comprising:
a source region, a drain region, and a gate electrode between the source region and the drain region;
a charge trapping material surrounding at least an upper portion of the gate electrode; and
an oxide material on sides of the charge trapping material, wherein the at least one transistor comprises a greater density of trapped holes than other transistors or the array of transistors.

27. A system, comprising:
at least one processor device operably coupled to at least one input device and at least one output device; and
a semiconductor device operably coupled to the at least one processor device, the semiconductor device comprising at least one memory cell comprising:
  a memory storage element; and
  a transistor, the transistor comprising:
    a gate electrode within a base material;
    an oxide material over at least a portion of the gate electrode;
    a charge trapping material over the oxide material;
    another oxide material over sides of the charge trapping material, a maximum distance between the gate electrode and the another oxide material between about 5 nm and about 6 nm; and
    a source region and a drain region on opposing sides of the gate electrode.

* * * * *

UNITED STATES PATENT AND TRADEMARK OFFICE
CERTIFICATE OF CORRECTION

Page 1 of 1

PATENT NO. : 10,833,087 B2
APPLICATION NO. : 16/107324
DATED : November 10, 2020
INVENTOR(S) : Fredrick D. Fishburn et al.

It is certified that error appears in the above-identified patent and that said Letters Patent is hereby corrected as shown below:

In the Specification

| | | |
|---|---|---|
| Column 1, | Lines 66-67, | change "gate-induced drain-leakage" to --gate-induced-drain-leakage-- |
| Column 4, | Line 43, | change "on-current which" to --on-current ($I_{on}$, which-- |
| Column 5, | Line 37, | change "silicon-on-insulator ("SOT")" to --silicon-on-insulator ("SOI")-- |
| Column 5, | Line 60, | change "MoN, Tr, IrOx" to --MoN, Ir, IrOx-- |
| Column 18, | Line 27, | change "the electrode material 442" to --the dielectric material 442-- |

Signed and Sealed this
Second Day of March, 2021

Drew Hirshfeld
*Performing the Functions and Duties of the*
*Under Secretary of Commerce for Intellectual Property and*
*Director of the United States Patent and Trademark Office*